United States Patent
Bossu et al.

(10) Patent No.: US 7,821,315 B2
(45) Date of Patent: Oct. 26, 2010

(54) ADJUSTABLE DUTY CYCLE CIRCUIT

(75) Inventors: Frederic Bossu, San Diego, CA (US); Anthony Francis Segoria, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 53 days.

(21) Appl. No.: 11/962,689

(22) Filed: Dec. 21, 2007

(65) Prior Publication Data

US 2009/0121763 A1 May 14, 2009

Related U.S. Application Data

(60) Provisional application No. 60/986,397, filed on Nov. 8, 2007.

(51) Int. Cl.
- H03K 3/017 (2006.01)
- H03K 5/04 (2006.01)
- H03K 7/08 (2006.01)

(52) U.S. Cl. .................. 327/175; 327/171; 327/238; 327/239; 327/254

(58) Field of Classification Search .......... 327/170–176, 327/261–290; 370/342, 320, 310, 319; 326/81, 326/104, 112, 121; 455/318
See application file for complete search history.

(56) References Cited

U.S. PATENT DOCUMENTS

| | | | |
|---|---|---|---|
| 4,061,882 A | 12/1977 | Dorren | |
| 5,103,114 A | 4/1992 | Fitch | |
| 5,375,258 A | 12/1994 | Gillig | |
| 6,320,418 B1 * | 11/2001 | Fujii et al. | 326/93 |
| 6,661,269 B2 | 12/2003 | Simon et al. | |
| 6,897,696 B2 | 5/2005 | Chang | |
| 7,184,512 B2 | 2/2007 | Takeshita | |
| 7,307,461 B2 | 12/2007 | Nguyen et al. | |
| 7,423,468 B2 | 9/2008 | Cho | |
| 2002/0079938 A1 * | 6/2002 | Saeki | 327/165 |
| 2005/0024097 A1 * | 2/2005 | Sim et al. | 327/77 |
| 2005/0174157 A1 * | 8/2005 | Calo' et al. | 327/308 |
| 2006/0059376 A1 * | 3/2006 | Ngo et al. | 713/300 |
| 2007/0037544 A1 * | 2/2007 | Heikkinen | 455/323 |
| 2007/0285120 A1 * | 12/2007 | Venditti et al. | 326/30 |
| 2008/0032646 A1 * | 2/2008 | Huang et al. | 455/131 |

FOREIGN PATENT DOCUMENTS

EP 1345317 9/2003

OTHER PUBLICATIONS

International Search Report and Written Opinion - PCT/US08/082926, International Searching Authority - European Patent Office, Jul. 9, 2009.

* cited by examiner

*Primary Examiner*—Lincoln Donovan
*Assistant Examiner*—Brandon S Cole
(74) *Attorney, Agent, or Firm*—Jiayu Xu

(57) ABSTRACT

Techniques are disclosed for adjusting and programming the duty cycle of a signal generated by a circuit. In an embodiment, parallel transistors are coupled between a NAND gate and a supply voltage. Selectively enabling the parallel transistors adjusts the switching point of the NAND gate, thereby allowing control of the pulse width of the output signal. In an alternative embodiment, the size of the PMOS versus the NMOS transistors in the NAND gate is selectively varied to achieve the same effect. Further disclosed are applications of the techniques to calibrating the receiver to minimize measured second-order inter-modulation products and/or residual sideband.

41 Claims, 14 Drawing Sheets

ADJUSTABLE DUTY CYCLE CIRCUIT

PRIORITY

This application claims benefit of U.S. Provisional Application No. 60/986,397 titled "ADJUSTABLE DUTY CYCLE CIRCUIT," filed Nov. 8, 2007, the entire disclosure of this application being considered part of the disclosure of this application.

TECHNICAL FIELD

The disclosure relates to electronic circuits and, more particularly, to circuits for generating signals having an adjustable duty cycle.

BACKGROUND

In the field of electronic circuit design, certain applications call for the availability of digital periodic signals having a controlled pulse width or duty cycle. For example, some communications receivers employ a local oscillator (LO) signal having a 25% duty cycle. Such receivers are disclosed in U.S. patent application Ser. No. 11/531,314, entitled "Systems, methods, and apparatus for frequency conversion," filed on Sep. 13, 2006, assigned to the assignee of the present invention, the contents of which are incorporated by reference herein in their entirety.

Various circuit designs may be employed to generate signals having a given nominal duty cycle. Due to processing variations and/or other factors, the actual duty cycle of a signal may differ from the specified nominal duty cycle. Inaccuracies in the actual duty cycle may degrade the performance of any given application. It would be advantageous to provide efficient techniques for adjusting and/or calibrating a signal's measured duty cycle to compensate for such inaccuracies.

SUMMARY

An aspect of the present disclosure provides a circuit for generating a signal having an adjustable duty cycle, the circuit comprising: a first stage for generating a first signal having a first duty cycle; a plurality of configurable transistors coupling the first stage to a supply voltage, each of the plurality of configurable transistors controlled by a plurality of voltages for turning on or off the corresponding configurable transistor, the first duty cycle adjustable by the settings of the configurable transistors.

Another aspect of the present disclosure provides a circuit for generating a signal having an adjustable duty cycle, the circuit comprising: a first stage for generating a first signal having a first duty cycle, the first stage comprising at least one set of transistors coupled in parallel, each transistor in said set of transistors having a gate voltage selectable from either an input voltage or a turn-off voltage.

Yet another aspect of the present disclosure provides a method for generating a local oscillator signal having an adjustable duty cycle, the method comprising dividing the frequency of the output of an oscillator to generate an in-phase divided signal and a quadrature divided signal; determining a first overlap interval between the in-phase divided signal and the quadrature divided signal to generate a first local oscillator signal, the first overlap interval defined by a first turn-on level and a first turn-off level; and adjusting the duty cycle of the first local oscillator signal by adjusting the first turn-on level or the second turn-off level.

Yet another aspect of the present disclosure provides an apparatus for generating a local oscillator signal having an adjustable duty cycle, the apparatus comprising means for dividing the frequency of the output of an oscillator to generate an in-phase divided signal and a quadrature divided signal; means for determining a first overlap interval between the in-phase divided signal and the quadrature divided signal to generate a first local oscillator signal, the first overlap interval defined by a first turn-on level and a first turn-off level; and means for adjusting the duty cycle of the first local oscillator signal by adjusting the first turn-on level or the second turn-off level.

DETAILED DESCRIPTION

According to the present disclosure, techniques are disclosed for adjusting the pulse width and/or duty cycle of a signal generated by a circuit.

Figure 1:
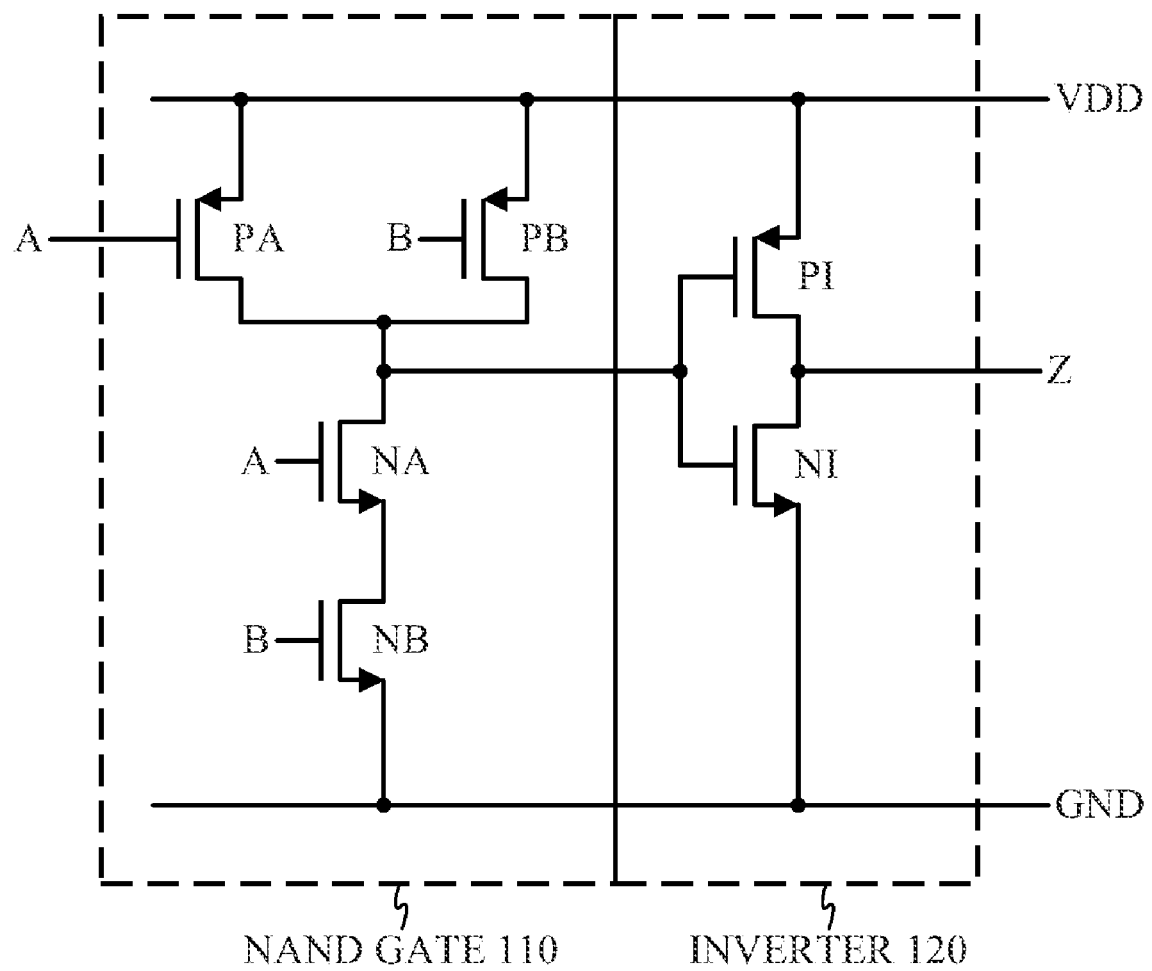
FIG. 1 depicts a circuit for generating a signal having a twenty-five percent duty cycle from an in-phase (A) and quadrature-phase (B) signal, signals A and B each having a fifty percent duty cycle.

FIG. 1 depicts a circuit for generating a signal having a twenty-five percent duty cycle from an in-phase (A) and quadrature-phase (B) signal, signals A and B each having a fifty percent duty cycle. In FIG. 1, PMOS transistors PA, PB and NMOS transistors NA, NB are configured as a standard two-input NAND gate 110. Signals A and B are input to the NAND gate, and the output of the NAND gate is coupled to an inverter 120 to produce an output signal Z. The signal Z corresponds to the output of applying an "AND" operation to signals A and B.

Figure 2:
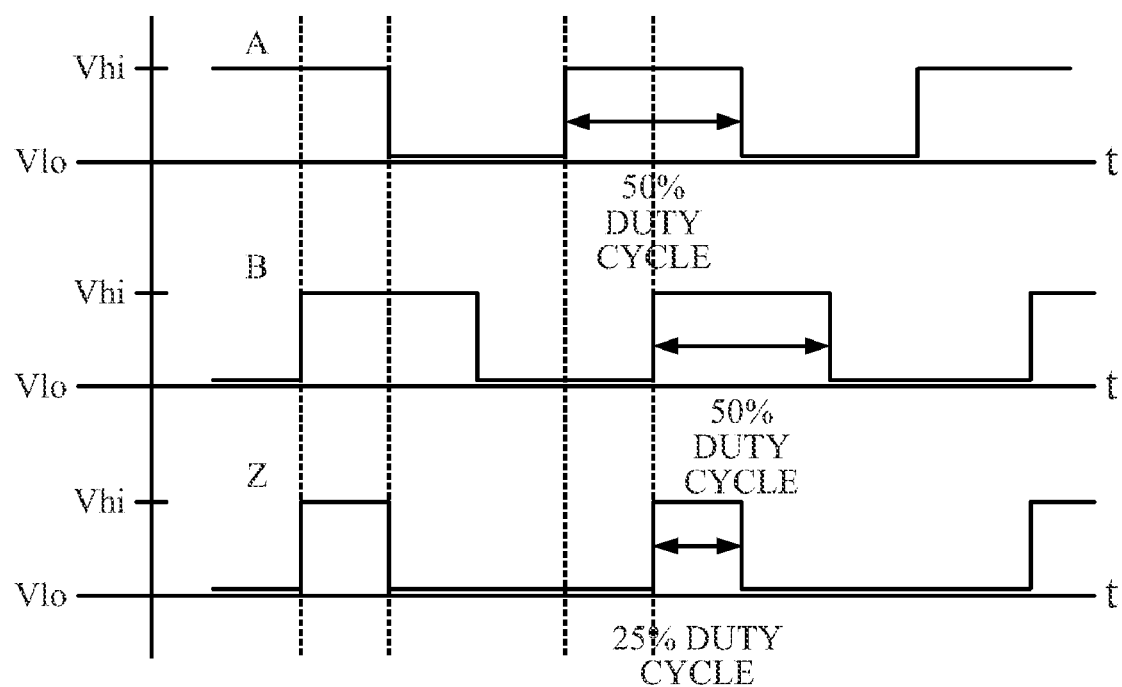
FIG. 2 depicts the relationship between signals A, B, and Z.

FIG. 2 depicts a relationship between signals A, B, and Z. In FIG. 2, signals A and B each have a fifty percent duty cycle, and have a quadrature phase relationship with each other. Signal Z, which is generated by applying an "AND" operation to signals A and B, has a duty cycle of 25%, as shown.

Note that the circuit for generating a twenty-five percent duty cycle referenced in this disclosure may be readily modified to generate a signal having an arbitrary duty cycle. For example, the phase relationship between signals A and B may be varied to accommodate generating signals having the desired duty cycle. Alternatively, the circuit may be modified to accommodate more than two inputs. Alternatively, logical gates other than NAND gates, such as NOR gates or XOR gates, may be employed. One of ordinary skill in the art will recognize that the techniques disclosed herein may be readily applied to such circuits, and that such embodiments are contemplated to be within the scope of the present disclosure.

Figure 3:
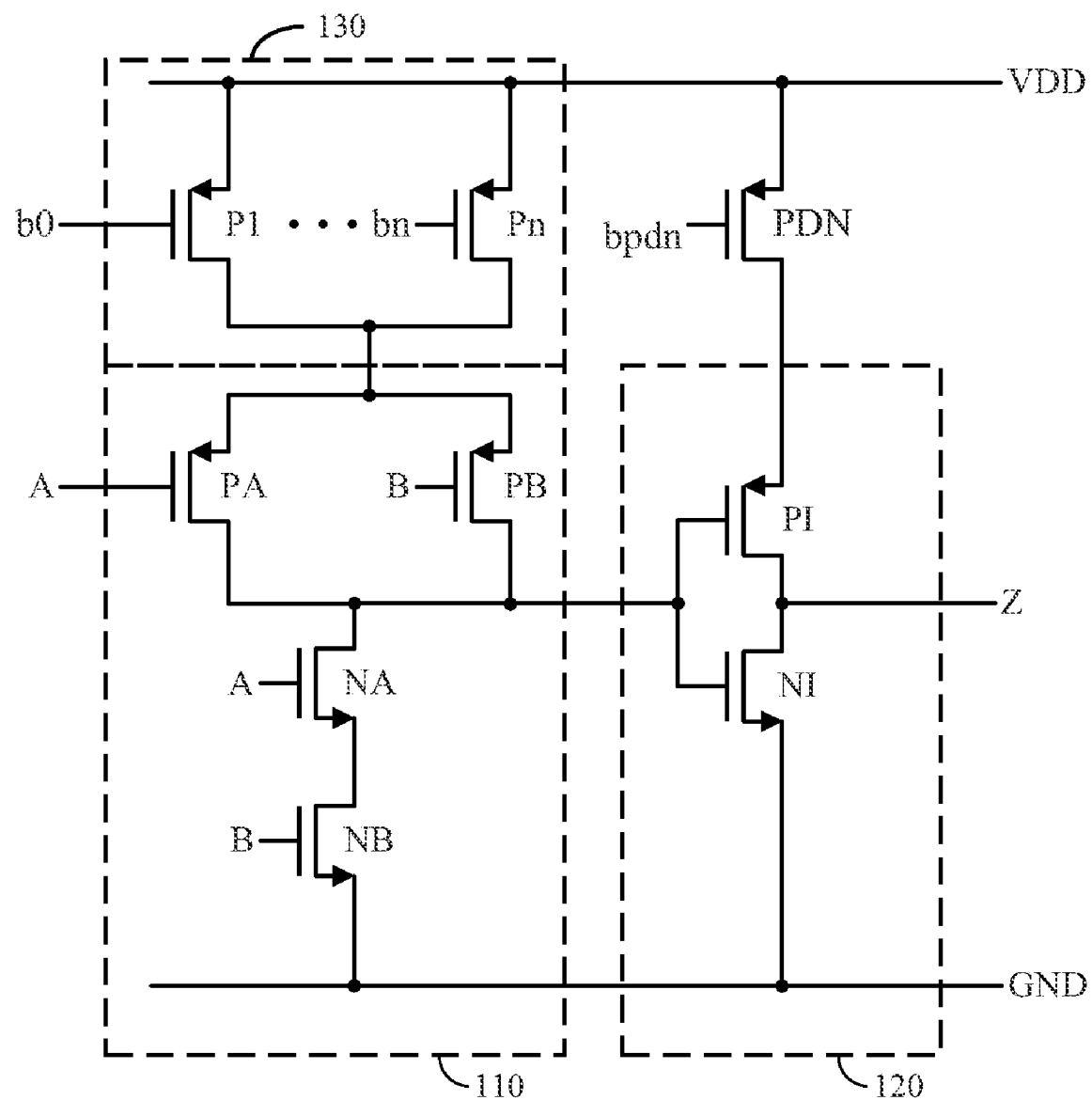
FIG. 3 depicts an embodiment of the present disclosure for adjusting the duty cycle of the signal Z depicted in FIGS. 1 and 2.

FIG. 3 depicts an embodiment of the present disclosure for adjusting the duty cycle of the signal Z depicted in FIGS. 1 and 2. In FIG. 3, PMOS transistors P1 through Pn 130 are provided between NAND gate 110 and the supply voltage VDD. Transistors P1 through Pn are controlled by gate voltages b0 through bn, respectively. The gate voltages may control whether each transistor is turned on or off. By selectively turning off a subset of the transistors P1 through Pn using gate voltages b0 through bn, the input switching voltage of the NAND gate can be modulated, allowing the duty cycle of the signal Z to be adjusted, as further described below.

In this specification and in the claims, the voltage level Vturn_on refers to the voltage level at which PMOS transistors PA and PB are turned off, thereby allowing the output of the NAND gate to be pulled low by the NMOS transistors. (Note this voltage level is designated to be a "turn-ON" voltage rather than a turn-OFF voltage for convenience in describing the output signal Z. One of ordinary skill in the art will recognize that the designation is arbitrary and may be readily substituted with alternative designations.) Conversely, the voltage level Vturn_off refers to the voltage level at which PMOS transistor PA or PB turns on, thereby allowing the output of the NAND gate to be pulled high by the PMOS transistor that is turned on.

Figure 4A:
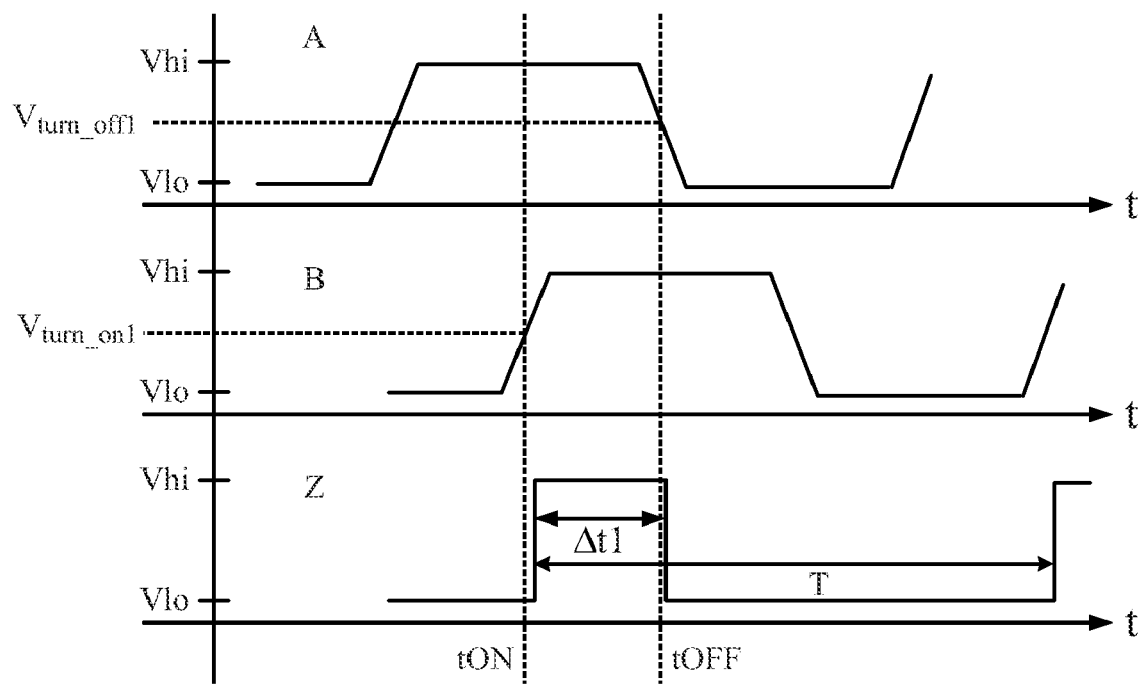
FIG. 4A depicts a first scenario labeled "Case 1" wherein transistor P0 is turned on by gate voltage b0, and the rest of the transistors P1 through Pn are turned off by gate voltages b1 through bn.

FIG. 4A depicts a first scenario labeled "Case 1" wherein transistor P0 is turned on by gate voltage b0, and the rest of the transistors P1 through Pn are turned off by gate voltages b1 through bn. This may be accomplished by setting gate voltage b0 to a low voltage, and setting the other gate voltages b1 through bn to a high voltage. Note in FIG. 4A, signals A and B are shown as having non-zero rise and fall times.

At time tON, signal A is high, while signal B just passes the voltage level Vturn_on1 during a transition from low to high. This causes the output of the NAND gate of FIG. 3 to transition from high to low, as both PMOS transistors are turned off, while both NMOS transistors are turned on. Thus the signal Z transitions from low to high shortly after time tON, as shown.

At time tOFF, signal B is high, while signal A just passes a voltage level Vturn_off1 during a transition from high to low. This causes the output of the NAND gate to transition from low to high, since transistor PA turns on, and transistor NA turns off. Thus the signal Z transitions from high to low shortly after time tOFF, as shown.

Note from FIG. 4A that the signal Z has a pulse width $\Delta t1$, where $\Delta t1$ depends on the voltage levels Vturn_on1 and Vturn_off1. For a periodic signal, this translates to a duty cycle of $\Delta t1/T$, where T is the period of the signal.

Figure 4B:
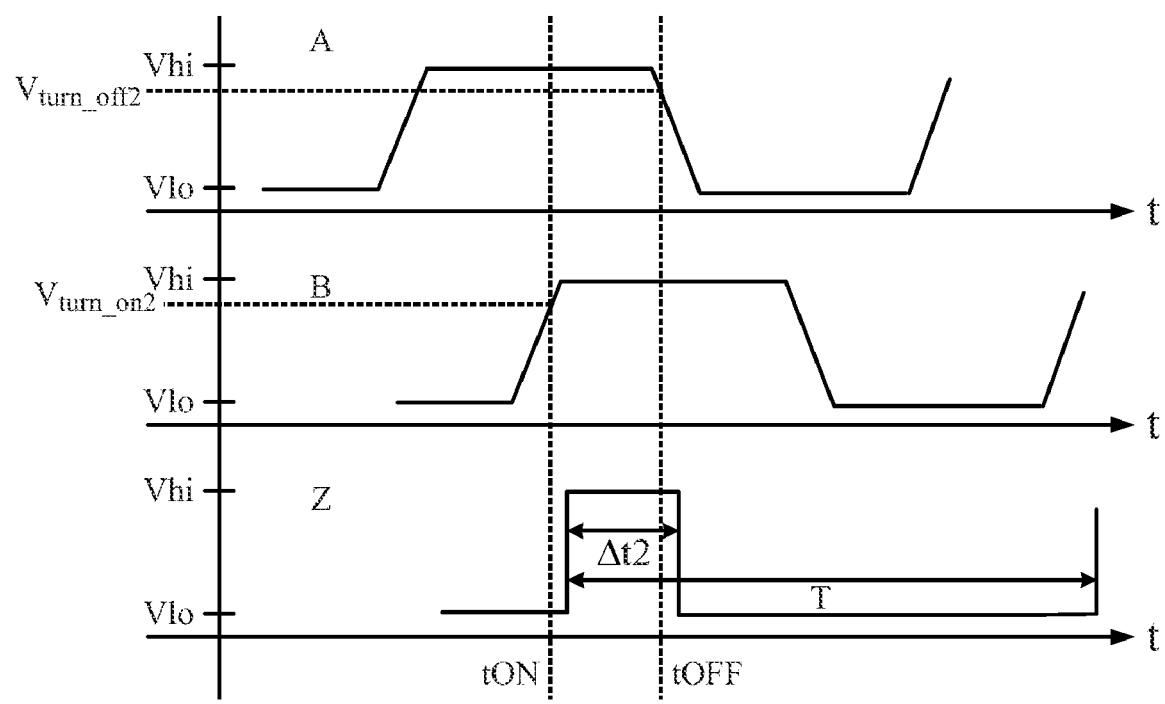
FIG. 4B depicts a second scenario labeled "Case 2" wherein all transistors P0 through Pn are turned on by gate voltages b0 through bn.

In general, the voltage levels Vturn_on and Vturn_off depend on the number of transistors P0 through Pn that are switched on or off. For "Case 1" shown in FIG. 4A, only transistor P0 is turned on. This will correspond to a lower level of Vturn_on and Vturn_off than if all transistors P0 through Pn are turned on. The latter scenario is illustrated in FIG. 4B labeled as "Case 2," and described further herein.

In particular, in Case 2, all transistors P0 through Pn are turned on by gate voltages b0 through bn. In this scenario, the levels of Vturn_on and Vturn_off, designated Vturn_on2 and Vturn_off2 in FIG. 4B, will be higher than the values of Vturn_on1 and Vturn_off1, respectively, as depicted in FIG. 4A. This in turn will make the pulse width $\Delta t2$ shown in FIG. 4B shorter than the corresponding pulse width $\Delta t1$ shown in FIG. 4A. The duty cycle of Z in Case 2 is thus shorter than in Case 1.

For intermediate cases where some arbitrary subset of the transistors P0 through Pn is turned on, and the remaining transistors in block 130 are turned off, the levels of Vturn_on and Vturn_off will generally vary depending on the collective size of the transistors P0 through Pn that are turned on.

From the preceding description, it can be appreciated that the gate voltages b0 through bn allow selective adjustment of the pulse width of the output signal Z. Assuming signals A and B are periodic, the duty cycle of the output signal Z is thus also adjustable. The preceding feature may be used to adjust the duty cycle of a signal from its nominal value. For example, in the embodiment shown in FIG. 3, transistors P0 through Pn may be used to fine tune the duty cycle of the output signal Z from its nominal value of 25%.

One of ordinary skill in the art will recognize that any number of PMOS transistors P0 through Pn with gate voltages b0 through bn may be provided in the circuit of FIG. 3, and that the more transistors and gate voltages are provided, the greater the achievable resolution in adjusting the duty cycle of the signal Z. Any subset of transistors P0 through Pn may be turned on or off by the appropriate gate voltages to effect a desired pulse width or duty cycle.

In an embodiment, to facilitate the selection of a desired pulse width, the sizes of transistors P0 through Pn may be binary weighted, i.e., P0 may have a width W1, P1 may have a width 2*W1, P2 may have a width 4*W1, etc. In an alternative embodiment, the PMOS transistors P0 through Pn may be equally sized.

Referring back to FIG. 3, note a power-down transistor PDN is provided to turn off the circuit when necessary. This can be achieved by setting the gate voltage bpdn of the PMOS transistor PDN to VDD. In normal operation, bpdn may be connected to ground.

Figure 5A:
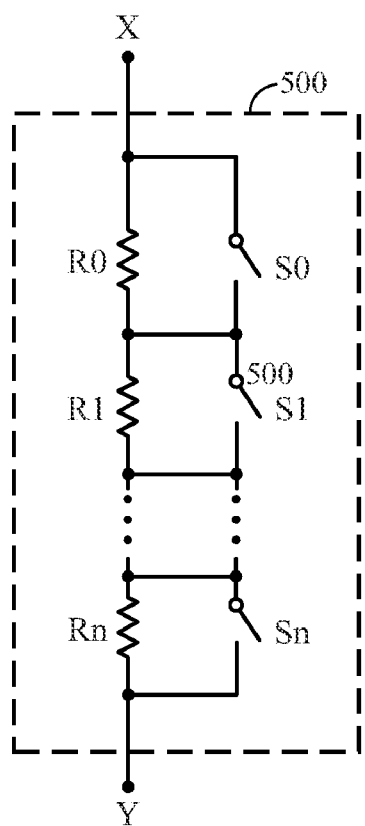
FIGS. 5A and 5B depict embodiments of variable resistance blocks 500 and 510.

In an embodiment, any circuit topology having configurable resistance may be used in place of the parallel PMOS transistors 130 shown in FIG. 3. For example, FIG. 5A depicts a variable resistance block 500. In FIG. 5A, a plurality of series resistances R0 through Rn is shown, each of which is bypassable by a corresponding switch S0 through Sn, respectively. Through the action of the switches S0 through Sn, the total resistance between the nodes X and Y is adjustable. The variable resistance block 500 may be coupled between the source voltage VDD and the source of transistors PA and PB in FIG. 1. The pulse width, and hence the duty cycle, of the output signal Z may be configured by the action of switches S0 through Sn. In an embodiment, the switches S0 through Sn may be MOS switches, and the resistances R0 through Rn may be MOS resistors.

Figure 5B:
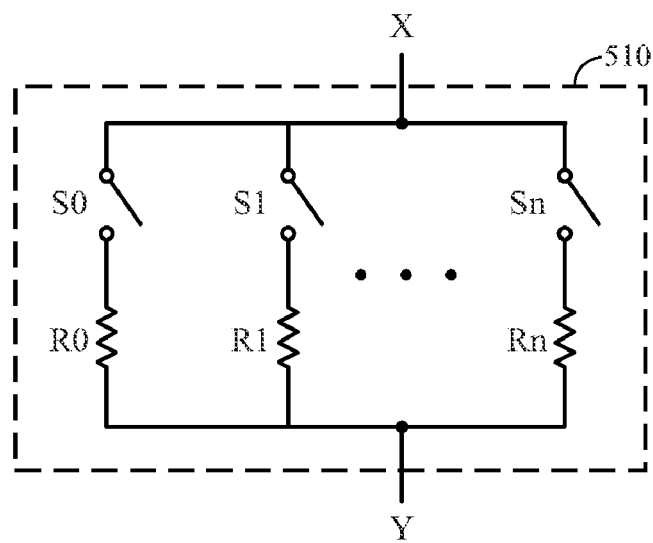

FIG. 5B shows an alternative embodiment of a variable resistance block 510 wherein a plurality of parallel resistors are provided, each resistor connected in series with a switch for enabling or disabling the resistor. These and other embodiments of the present disclosure will be clear to those of ordinary skill in the art, and are contemplated to be within the scope of the present disclosure.

Figure 5C:
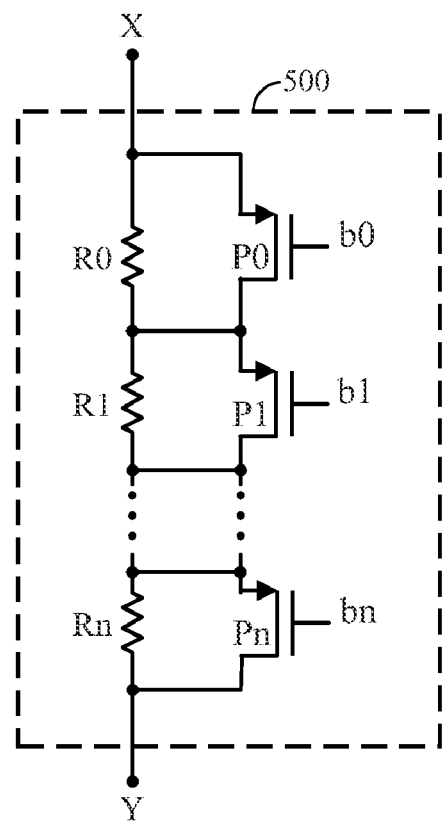
FIGS. 5C and 5D depict embodiments of variable resistance blocks 500 and 510.

FIG. 5C shows an alternative embodiment of a variable resistance block 500. In FIG. 5C, a plurality of series resistances R0 through Rn is shown, each of which is bypassable by a corresponding MOS transistor, PG through Pn, configured as a switch. Each of the transistor switches PG through Pn may be selectively turned on via a control signal that is input on a control signal input lead b0 through bn. Similar to FIG. 5A, through the action of transistor switches PG through Pn, the total resistance between nodes X and Y is adjustable. As discussed above, the resistances R0 through Rn may be MOS resistors.

Figure 5D:
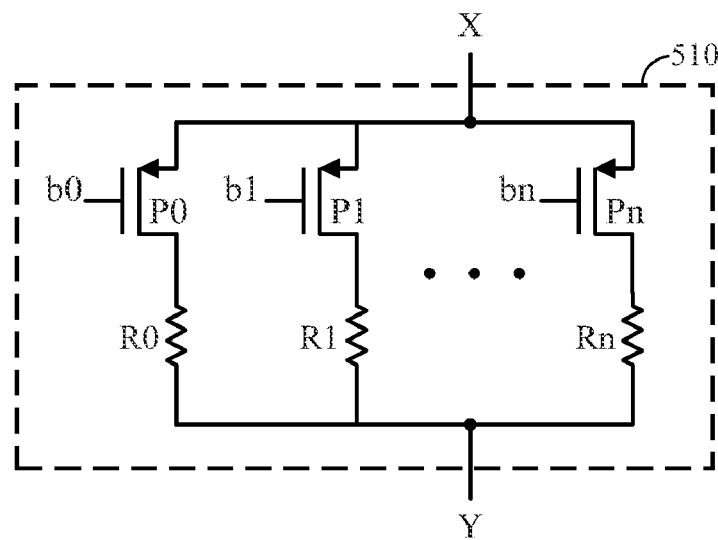

FIG. 5D shows an alternative embodiment of a variable resistance block 510. In FIG. 5D, a plurality of parallel resistances R0 through Rn is shown. Each of resistances R0 through Rn is coupled in series to a transistor switch PG through Pn for enabling or disabling the resistor. As with variable resistance block 500 shown in FIG. 5C, each of the transistor switches PG through Pn may be selectively turned on via a control signal that is input on a control signal input lead b0 through bn. Similar to FIGS. 5A-5C, through the action of transistor switches PG through Pn, the total resistance between nodes X and Y is adjustable. As discussed above, the resistances R0 through Rn may be MOS resistors.

One of ordinary skill in the art will recognize that a variable resistance block as shown in any of FIGS. 5A-5C may be coupled to the source of transistor NB in the circuit of FIG. 1. One of ordinary skill in the art will recognize that the PMOS transistors shown in FIGS. 5C and 5D may be replaced with NMOS transistors when the variable resistance block is coupled to the source of transistor NB in the circuit of FIG. 1. By coupling any of the variable resistance blocks to transistor NB the duty cycle of the output signal Z may be made adjustable by selectively enabling such resistors or NMOS transistors according to the techniques described. Such embodiments are contemplated to be within the scope of the present invention.

Figure 6:
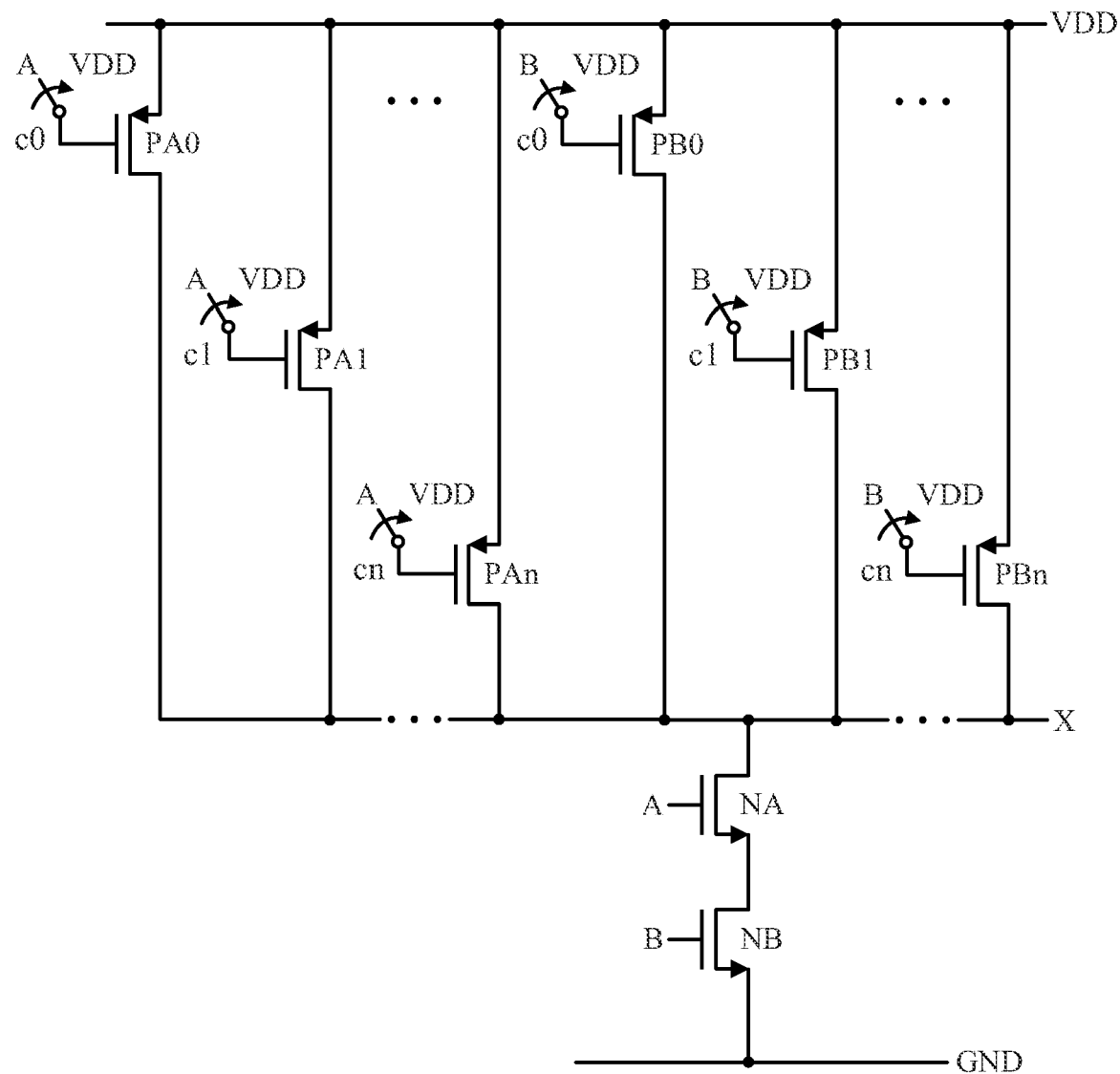
FIG. 6 depicts an alternative embodiment of the present disclosure, wherein the effective widths of transistors PA and PB may be concurrently adjusted to control the pulse width of the output signal Z.

FIG. 6 depicts an alternative embodiment of the present disclosure, wherein the effective widths of transistors PA and PB in FIG. 1 may be concurrently adjusted to control the pulse width of the output signal Z. In FIG. 6, transistor PA from FIG. 1 is implemented as a plurality of parallel transistors PA0 through PAn. Transistors PA0 through PAn may be turned on or off by voltages c0 through cn, respectively, which selectively couple the gate of each transistor either to the input signal A (transistor ON) or to the supply voltage VDD (transistor OFF). Similarly, transistor PB from FIG. 1 is implemented as a plurality of parallel transistors PB0 through PBn. Each of transistors PB0 through PBn may also be turned on or off by the same voltages c0 through cn used to control transistors PA0 through PAn.

According to the embodiment of FIG. 6, the input switching voltage levels Vturn_on and Vturn_off can be adjusted by selectively turning on or off the transistors PA0 through PAn and PB0 through PBn using voltages c0 through cn. In particular, if all transistors PA0 through PAn and PB0 through PBn are turned on (i.e., the maximum effective widths for transistors PA and PB are provided), then the voltage levels Vturn_on and Vturn_off will be higher than if only a subset of the transistors are turned on (i.e., less than the maximum effective width for each of transistors PA and PB is provided). As seen with reference to FIGS. 4A and 4B, the higher the level of Vturn_on and Vturn_off, the shorter the pulse width of the output signal Z. Thus it is seen that by selecting the effective width of the transistors PA and PB using voltages c0 through cn, the pulse width of the output signal may be controlled.

One of ordinary skill in the art will recognize that the effective sizes of PA and PB need not both be made adjustable. In an embodiment, the effective size of either PA only or PB only may be made adjustable. Alternatively, a set of control voltages c0 through cn may be provided for one of the PMOS transistors, while a separate set of control voltages d0 through dn is provided for the other PMOS transistor. Such embodiments are within the scope of the present disclosure.

One of ordinary skill in the art will recognize that the effective widths of the NMOS transistors NA and NB in FIG. 1 may also be made configurable to adjust the pulse width of the output signal Z. Such embodiments are within the scope of the present disclosure.

In alternative embodiments of the present disclosure employing alternative circuitry for generating a signal Z from signals A and B other than those shown in FIGS. 3 and 6, a general "turn-on level" and "turn-off level" may be defined with respect to FIGS. 4A and 4B as follows. The turn-on level is the input level for either A or B at which the output signal Z (or the inverse of Z) is caused to transition from high to low. Similarly, the turn-off level is the input level for either A or B at which the output signal Z (or the inverse of Z) is caused to transition from low to high. Accordingly, a general "turn-on time" and "turn-off time" may be defined as the times at which either input signal A or B crosses the turn-on level or turn-off level, causing the output signal Z to transition. In this specification and in the claims, the interval between the "turn-on time" and the "turn-off time" may be defined as an "overlap interval." According to an aspect of the present disclosure, the duty cycle of a signal Z is adjusted by varying the turn-on level and turn-off level for a given circuitry for generating Z from A and B, thus varying the overlap interval.

For example, in the embodiment depicted in FIG. 3, the turn-on level corresponds to the voltage level at which PMOS transistors PA and PB turn off, while the turn-off level corresponds to the voltage level at which one of PMOS transistors PA and PB turns on. In the embodiment depicted in FIG. 6, the turn-on level corresponds to the voltage level for A or B at which the node X is pulled low, while the turn-off level corresponds to the voltage level for A or B at which the node X is pulled high. One of ordinary skill in the art may derive embodiments not disclosed herein for performing the same signal generation functions as those described for the circuitry of FIGS. 3 and 6. It is contemplated that the designation of turn-on level, turn-off level, turn-on time, turn-off time, and overlap interval may apply to such embodiments as well.

Figure 7:
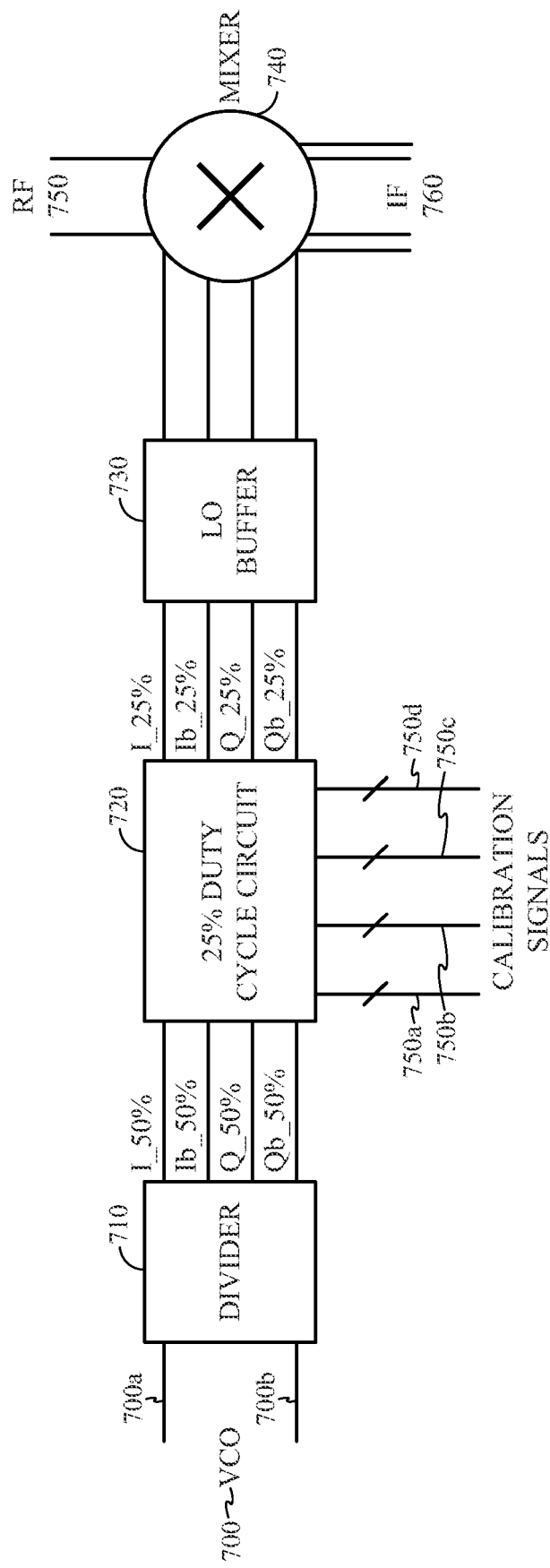
FIG. 7 depicts an embodiment of a communications receiver comprising a mixer for mixing a received radio frequency (RF) signal with a local oscillator (LO) signal to generate an intermediate frequency (IF) signal.

FIG. 7 shows a possible application of the present techniques to the calibration of an oscillator's duty cycle in a communications receiver. In particular, FIG. 7 depicts a receiver comprising a mixer 740 for mixing a received radio frequency (RF) signal 750 with a processed version of a voltage-controlled oscillator signal 700 to generate intermediate frequency (IF) signals 760. In this specification and in the claims, the term "intermediate frequency" may denote any frequency, including a zero frequency (or "baseband") in the case of a direct conversion receiver.

In FIG. 7, a voltage-controlled oscillator (VCO) 700 outputs a differential signal 700a, 700b to a divider 710. Divider 710 divides the frequency by a factor, e.g. 2 or 4, and generates signals I_50%, Ib_50%, Q_50%, Qb_50%. One of ordinary skill in the art will realize that divider 710 may divide the frequency by any factor other than those explicitly listed. Such embodiments are contemplated to be within the scope of the present disclosure.

Figure 8:
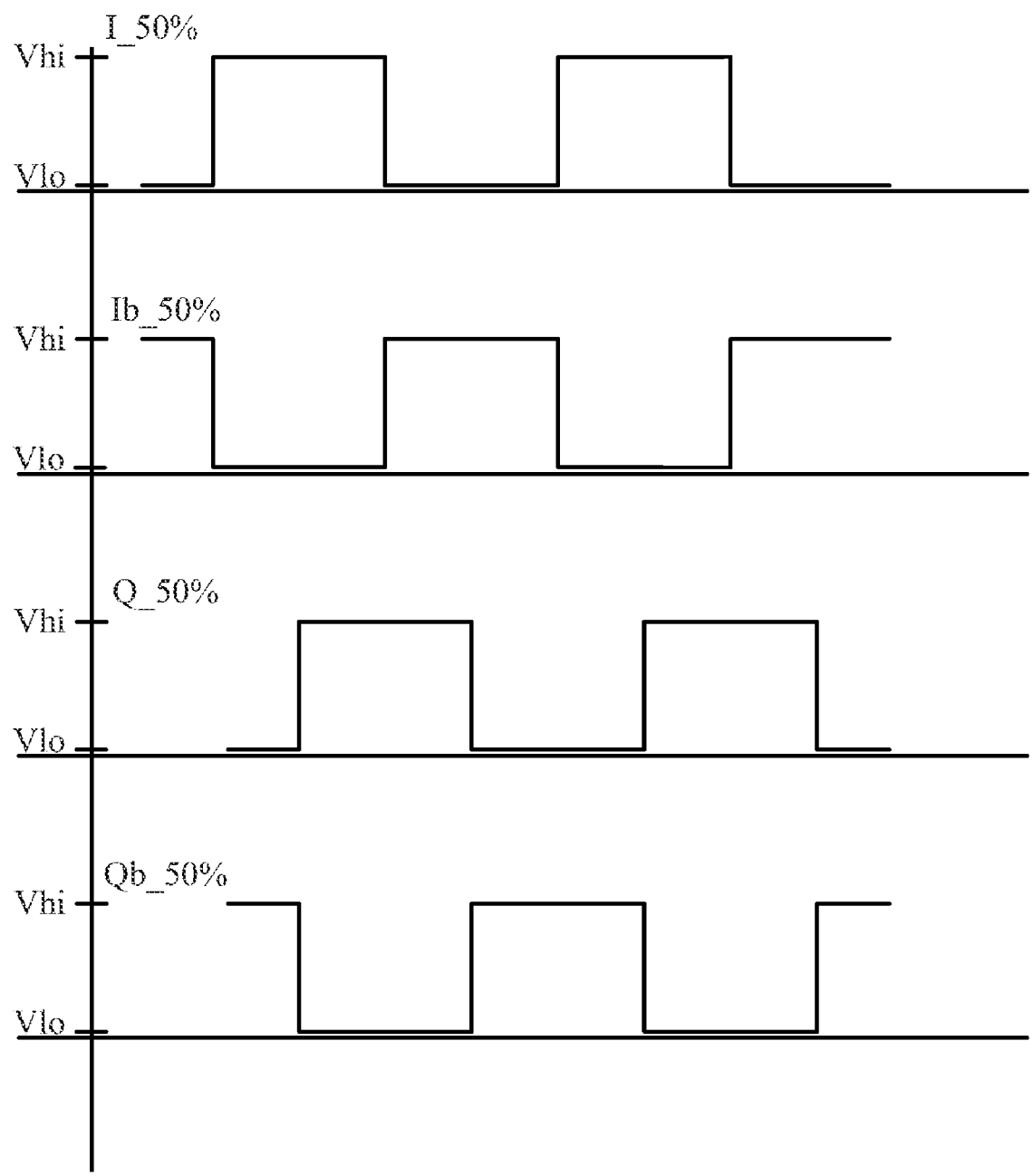
FIG. 8 depicts the relationship of signals I_50%, Ib_50%, Q_50%, Qb_50% to each other.
Figure 8A:
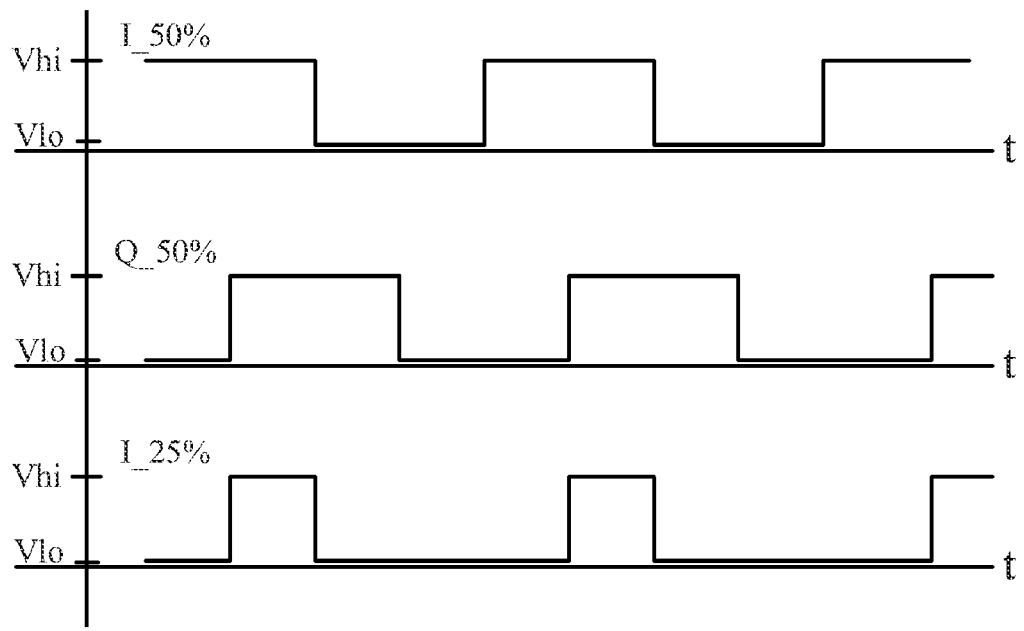
FIGS. 8A-8D illustrate how the signals I_50%, Q_50%, Ib_50%, Qb_50% may be combined to generate the signals I_25%, Q_25%, Ib_25%, Qb_25%.
Figure 8B:
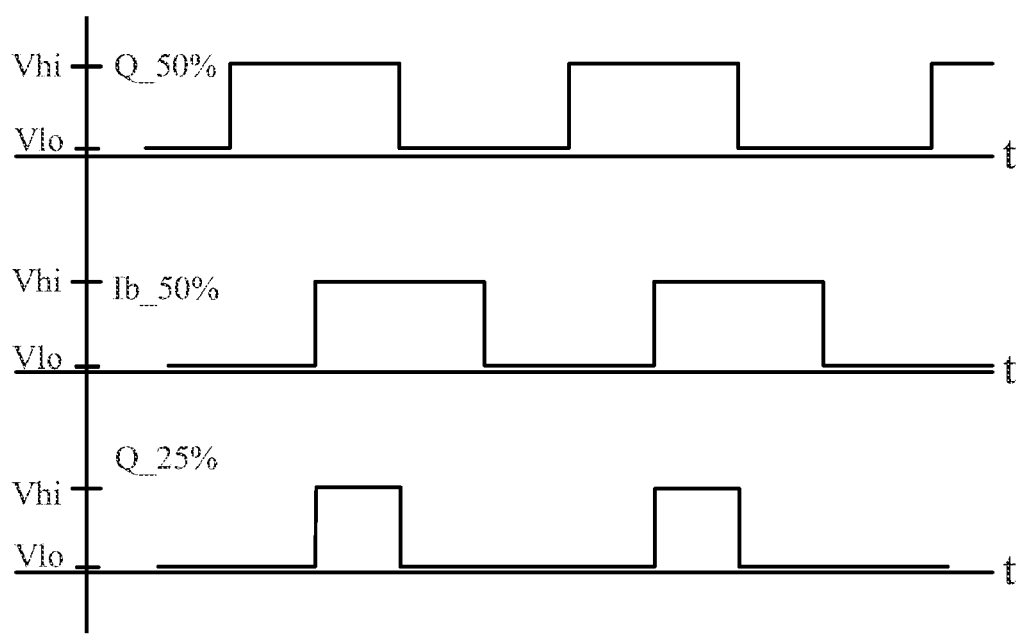
Figure 8C:
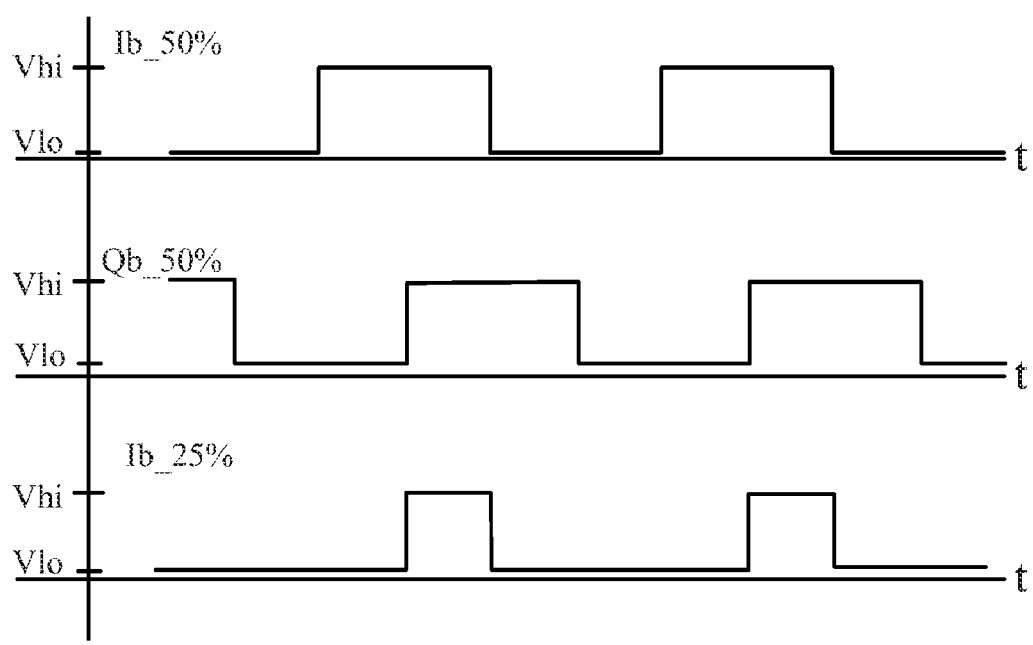
Figure 8D:
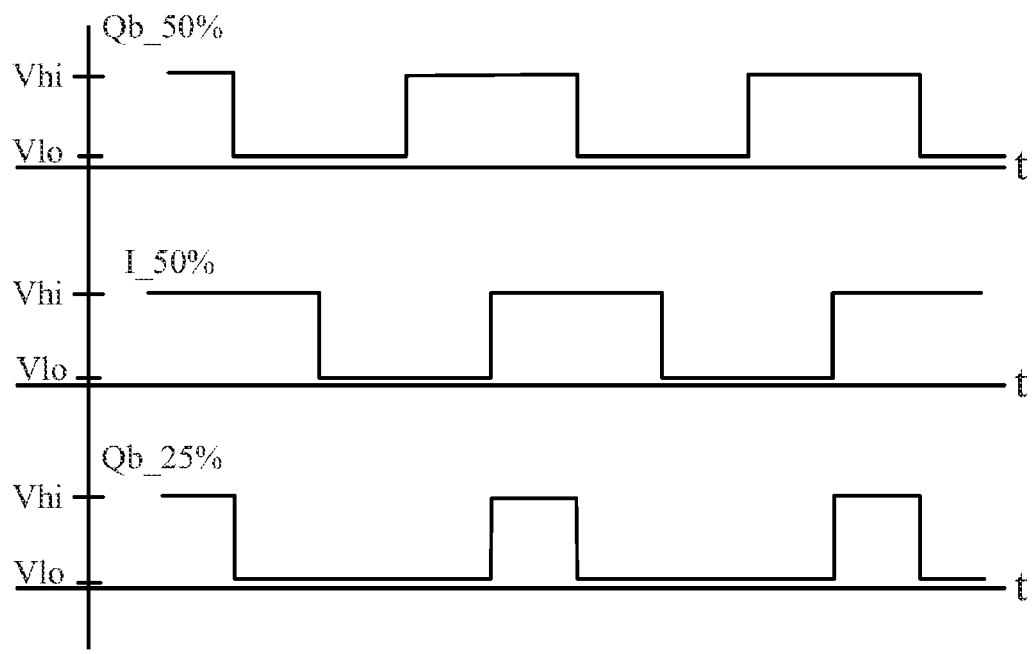

As noted in their designations, each of the four signals I_50%, Ib_50%, Q_50%, Qb_50% has a nominal 50% duty cycle. FIG. 8 depicts the relationship between the four signals. As illustrated in FIG. 8, Ib_50% and Qb_50% are the inverse (180-degree out-of-phase) versions of I_50% and Q_50%, respectively, while I_50% and Q_50% have a quadrature relationship with each other.

Returning to FIG. 7, 25% duty cycle circuit 720 inputs four signals I_50%, Ib_50%, Q_50%, Qb_50%, and generates four corresponding signals I_25%, Ib_25%, Q_25%, Qb_25% each having a nominal 25% duty cycle. Further details and motivation for a receiver utilizing an LO having 25% duty cycle may be found in U.S. patent application Ser. No. 11/531,314, previously referenced in this disclosure.

Each 25% duty cycle signal may be generated from a pair of 50% duty cycle signals. For example, the signals I_50% and Q_50% may be input to the circuit of FIG. 3 as signals A and B, respectively, to generate the signal I_25%. 25% duty cycle circuit 720 may thus be provided with four instances of the circuit shown in FIG. 3 to generate the four 25% duty cycle signals. FIGS. 8A-8D illustrate how the signals I_50%, Q_50%, Ib_50%, Qb_50% may be combined to generate the signals I_25%, Q_25%, Ib_25%, Qb_25%. Note one of ordinary skill in the art will realize that the naming of the signals as "in-phase" or "quadrature" may be different in any particular embodiment of the disclosure. Such embodiments employing different nomenclature are also contemplated to be within the scope of the present disclosure.

In accordance with the techniques described with reference to FIG. 3, calibration signals 750a, 750b, 750c, 750d may be provided to adjust the nominal duty cycle of each of signals I_25%, Ib_25%, Q_25%, Qb_25%. The calibration signals may be provided to compensate for any deviations of the actual duty cycles of the signals from the nominal value of 25%.

For example, calibration signal 750a may comprise a plurality of voltages b0 through bn that set the duty cycle of the I_25% output signal to a desired value. These voltages b0 through bn may correspond to the gate voltages depicted in FIG. 3.

In an alternative embodiment, 25% duty cycle circuit 720 may be provided with four instances of the circuit shown in FIG. 6 to generate the four 25% duty cycle signals. Calibration signal 750a may then comprise, for example, a plurality of voltages c0 through cn as depicted in FIG. 6.

Note in an embodiment, the 25% duty cycle circuit 720 need not comprise the adjustable duty cycle circuits disclosed in FIG. 3 or 6. It is contemplated that any circuitry allowing adjustment of the duty cycle of a signal may be utilized.

The four signals I_25%, Ib_25%, Q_25%, Qb_25% may be buffered by local oscillator buffer 730. The buffered signals may then be provided to mixer 740, which mixes the LO signals with an incoming RF signal 750 to generate an IF signal 760. In an embodiment, the mixer 740 includes two mixers: one for mixing the differential RF signal 750 with a differential signal composed of I_25% and Ib_25%, and another for mixing the differential RF signal 750 with a differential signal composed of Q_25% and Qb_25%. Two IF signals may thus be generated: an in-phase IF signal, and a quadrature-phase IF signal.

According to the present disclosure, techniques for adjusting the pulse width and/or duty cycle of a signal generated by a circuit have been described. A further aspect of the present disclosure provides for optimally setting the duty cycles of the signals generated by the 25% duty cycle circuit depicted in FIG. 7. This may be achieved through a calibration set-up and procedure, as illustrated and described herein with reference to FIGS. 9 and 10.

Figure 9:
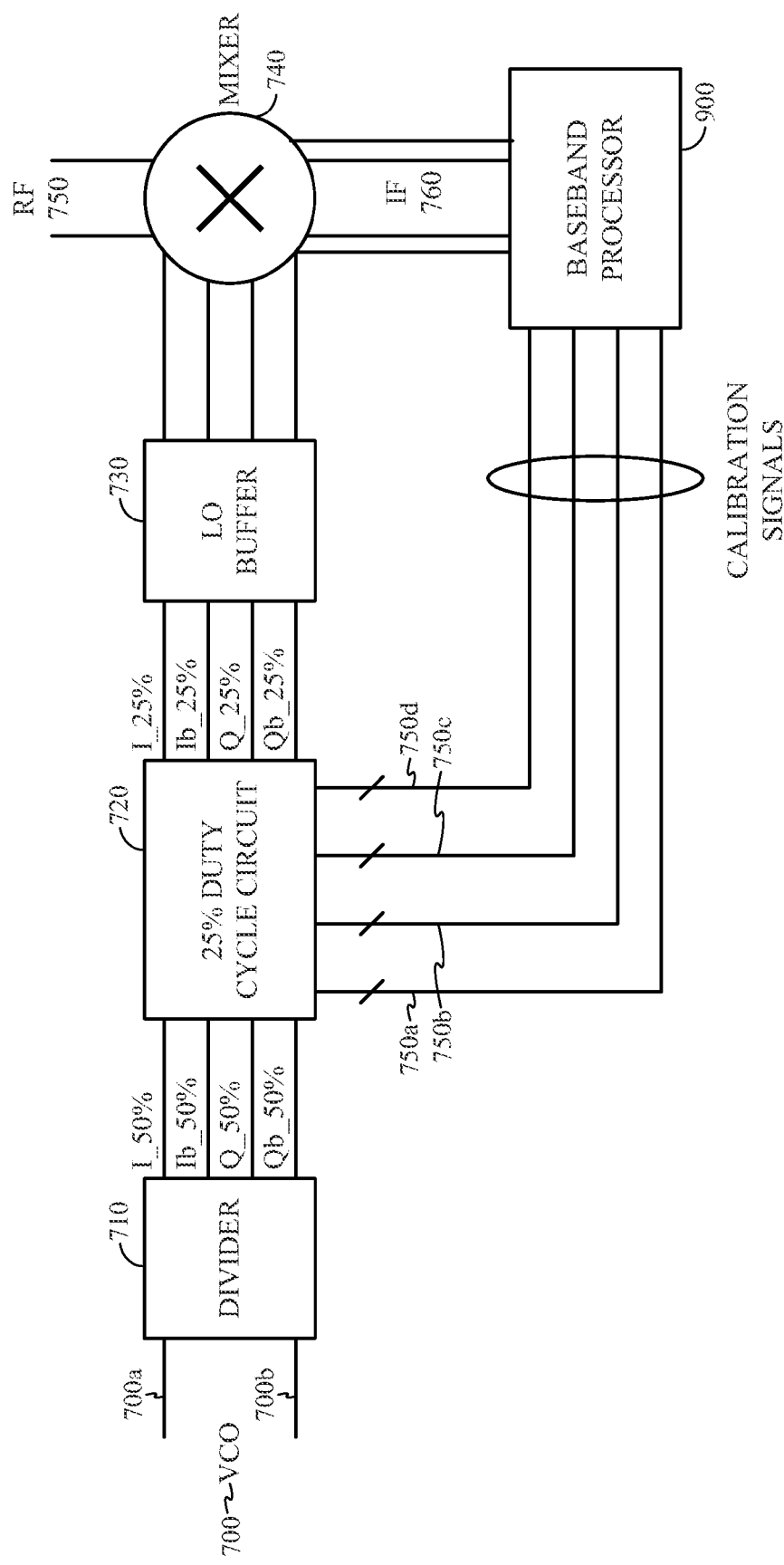
FIG. 9 depicts the communications receiver of FIG. 7, wherein the IF output signal 760 of the mixer 760 is a zero-IF baseband signal, i.e., the receiver is a direct-conversion receiver.

FIG. 9 depicts the communications receiver of FIG. 7, wherein the IF output signal 760 of the mixer 760 is a zero-IF baseband signal, i.e., the receiver is a direct-conversion receiver. The IF signal 760 is further supplied to a baseband processor 900. Based on the IF signal 760, the baseband processor 900 generates the calibration signals 750a, 750b, 750c, 750d. In an embodiment, the calibration signals 750a, 750b, 750c, 750d may be set to optimize a second-order input intercept point (IIP2) of the receiver as measured by the baseband processor 900 from the IF signal 760. In another embodiment, the calibration signals may be set to minimize a measured residual sideband (RSB) of the receiver as measured by the baseband processor 900 from the IF signal 760. In yet another embodiment, the calibration signals may be set to jointly optimize the IIP2 and the RSB of the receiver.

Figure 10:
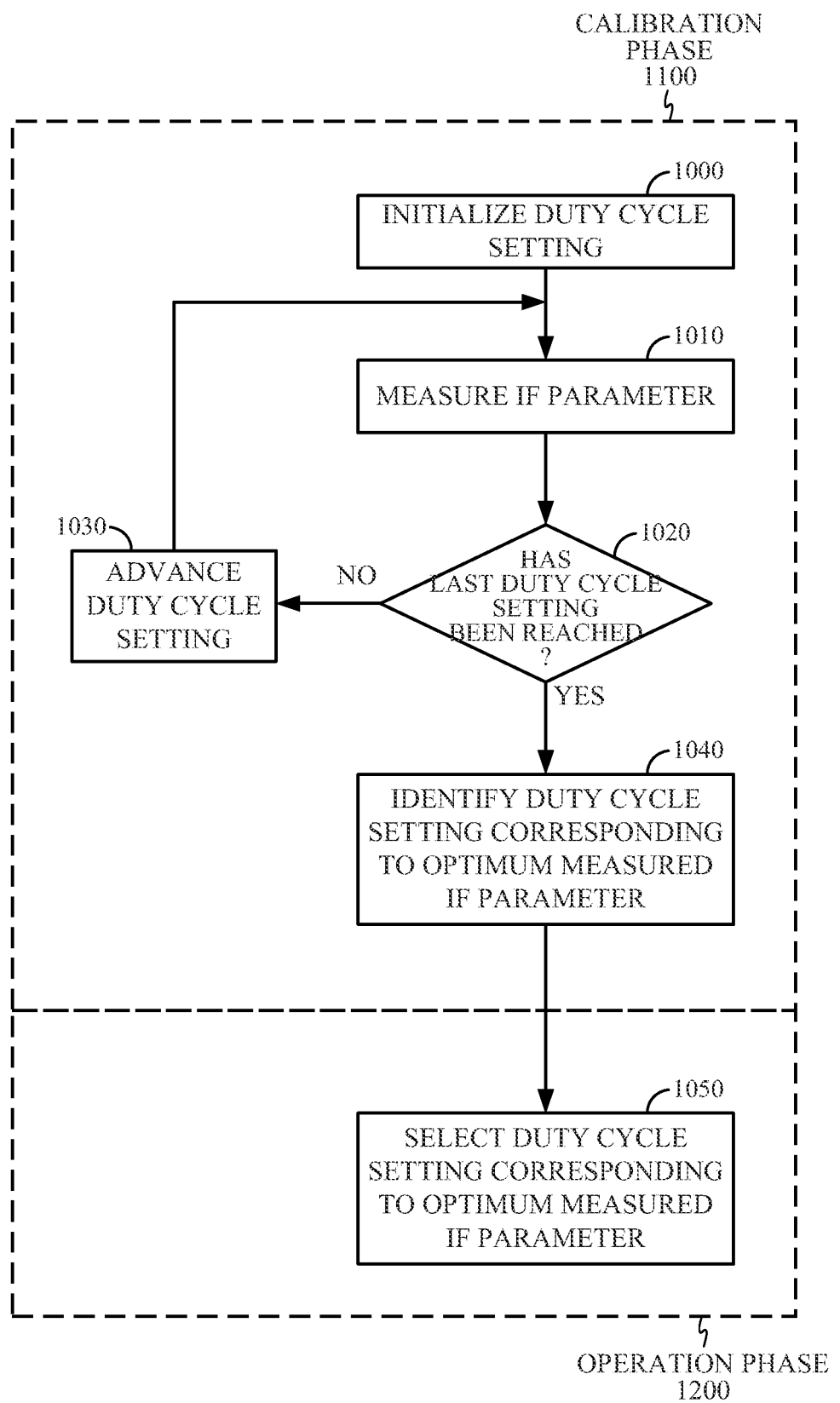
FIG. 10 depicts an embodiment of an algorithm for calibrating a duty cycle setting for the 25% duty cycle circuit in FIG. 9.

FIG. 10 depicts an embodiment of an algorithm for calibrating a duty cycle setting for the 25% duty cycle circuit in FIG. 9. In FIG. 10, a calibration phase 1100 begins with step 1000 selecting initial values for the duty cycle setting of the signals generated by the 25% duty cycle circuit. In an embodiment, the initial values of the duty cycles may correspond to the lowest duty cycles attainable by setting the calibration signals 750a, 750b, 750c, 750d. These calibration signals may be selected by the baseband processor 900, as depicted in FIG. 9.

At step 1010, a parameter of the IF signal 760 corresponding to the selected duty cycle may be measured and recorded by the baseband processor 900. In an embodiment, the parameter of interest may be a second-order intermodulation product (IM2) present in the IF signal 760. In an alternative embodiment, the parameter of interest may be a residual sideband (RSB) present in the IF signal 760.

At step 1020, the algorithm determines whether a last duty cycle setting has been reached. If not, then the duty cycle setting may be advanced to a next candidate duty cycle setting in step 1030 by setting the calibration signals 750a, 750b, 750c, 750d to the appropriate values. The algorithm then returns to step 1010, wherein the parameter of interest corresponding to the new duty cycle may be measured. Once the last duty cycle setting has been reached in step 1020, the algorithm proceeds to step 1040.

In this way, the parameter of interest measured in step 1010 may be "swept" over a suitable range of duty cycle settings. After the entire range has been swept, the duty cycle setting corresponding to the optimum value of the parameter of interest is identified at step 1040. In an embodiment, the duty cycle setting or settings corresponding to the lowest measured IM2 in the IF signal 760 may be identified. In an alternative embodiment, the duty cycle setting or settings corresponding to the lowest measured RSB in the IF signal 760 may be identified. At step 1050, the duty cycle settings identified in step 1040 are selected and applied to the 25% duty cycle circuit 720 during an operational phase 1200 of the receiver.

While a specific algorithm for determining an optimal duty cycle setting has been described herein, one of ordinary skill in the art will realize that other algorithms for sweeping through calibration settings to determine an optimal setting may be applied. For example, one may employ calibration algorithms disclosed in U.S. patent application Ser. No. 11/864,310, entitled "Offset correction for passive mixers," filed Sep. 28, 2007, assigned to the assignee of the present application, the contents of which are hereby incorporated by reference in their entirety.

Note the calibration techniques disclosed herein may also be applied to optimize any other parameters of interest besides those explicitly described. Such embodiments are also contemplated to be within the scope of the present disclosure. While embodiments have been described that utilize a 25% duty cycle for the local oscillator, the calibration scheme and duty cycle adjustment techniques of the present disclosure may be applied to calibrate signals having any duty cycle. Such embodiments will be clear to those of ordinary skill in the art, and are contemplated to be within the scope of the present disclosure.

Based on the teachings described herein, it should be apparent that an aspect disclosed herein may be implemented independently of any other aspects and that two or more of these aspects may be combined in various ways. The techniques described herein may be implemented in hardware, software, firmware, or any combination thereof. If implemented in hardware, the techniques may be realized using digital hardware, analog hardware or a combination thereof. If implemented in software, the techniques may be realized at least in part by a computer-program product that includes a computer readable medium on which one or more instructions or code is stored.

By way of example, and not limitation, such computer-readable media can comprise RAM, such as synchronous dynamic random access memory (SDRAM), read-only memory (ROM), non-volatile random access memory (NVRAM), ROM, electrically erasable programmable read-only memory (EEPROM), erasable programmable read-only memory (EPROM), FLASH memory, CD-ROM or other optical disk storage, magnetic disk storage or other magnetic storage devices, or any other tangible medium that can be used to carry or store desired program code in the form of instructions or data structures and that can be accessed by a computer.

The instructions or code associated with a computer-readable medium of the computer program product may be executed by a computer, e.g., by one or more processors, such as one or more digital signal processors (DSPs), general purpose microprocessors, ASICs, FPGAs, or other equivalent integrated or discrete logic circuitry.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

A number of aspects and examples have been described. However, various modifications to these examples are possible, and the principles presented herein may be applied to other aspects as well. These and other aspects are within the scope of the following claims.

The invention claimed is:

1. A circuit for generating an output signal having a duty cycle that is adjustable, the circuit comprising:
    a first signal input lead that receives a first input signal having a duty cycle of approximately fifty percent of a reference input signal;
    a second signal input lead that receives a second input signal having a duty cycle of approximately fifty percent of the reference input signal, wherein the second input signal and the first input signal have the same frequency, and wherein the second input signal is approximately ninety degrees out of phase with respect to the first input signal;
    a signal output lead that outputs the output signal, wherein the duty cycle of output signal is approximately twenty-five percent of the reference input signal; and
    a plurality of control signal input leads usable to receive control signals, wherein each of the plurality of control signal is usable to adjust a resistance of a variable resistance block, the resistance through the variable resistance being used to adjust the duty cycle of the output signal.

2. The circuit of claim 1, wherein the circuit comprises:
    a first stage that outputs the output signal onto the signal output lead, wherein the first input lead and the second input lead are input leads of the first stage, and wherein the signal output lead is an output lead of the first stage; and
    wherein:
        the variable resistance block couples the first stage to a supply voltage,
        the duty cycle of the output signal is adjusted by the voltage across the variable resistance block, wherein the control signals on the control signal input leads of the circuit selectively varies the resistance across the variable resistance block.

3. The circuit of claim 2, wherein the variable resistance block comprises a plurality of configurable transistors arranged in parallel.

4. The circuit of claim 3, each of the control signals is coupled to a gate of each corresponding configurable transistor to selectively turn on or off the configurable transistor.

5. The circuit of claim 4, the first stage comprising a two-input NAND gate and an inverter, the NAND gate comprising two parallel PMOS transistors coupled to two series NMOS transistors, the output signal being a signal output by the inverter.

6. The circuit of claim 5, the plurality of configurable transistors being PMOS transistors binary weighted in size.

7. The circuit of claim 5, wherein the first input signal is received onto a first of the two inputs of the NAND gate, wherein the second input signal is received onto a second of the two inputs of the NAND gate, the first and second input signals having a quadrature phase difference.

8. The circuit of claim 2, wherein variable resistance block comprises a plurality of resistors coupled in series each of which is coupled to a switch coupled in parallel, each switch configured to direct current through or around the corresponding one of the plurality of resistors in response to a corresponding control signal to generate the variable resistance.

9. The circuit of claim 8, wherein each switch is a MOS switch.

10. The circuit of claim 8, wherein each resistor is a MOS resistor.

11. The circuit of claim 2, wherein the variable resistance block comprises a plurality of resistors coupled in parallel each of which is coupled to a switch in series, each switch configured to direct current through the resistor when closed to generate the variable resistance in response to a corresponding control signal.

12. The circuit of claim 11, wherein each switch is a MOS switch.

13. The circuit of claim 11, wherein each resistor is a MOS resistor.

14. The circuit of claim 1, further comprising:
    a NAND gate having a first input lead, a second input lead and an output lead, wherein the first input lead of the NAND gate is the first signal input lead of the circuit, wherein the second input lead of the NAND gate is the second signal input lead of the circuit;
an inverter that has an input lead coupled to the output lead of the NAND gate, wherein an output lead of the inverter is the signal output lead of the circuit; and
a power-down transistor coupling the inverter to the supply voltage, wherein:
the variable resistance block coupling the NAND gate to a supply voltage, the duty cycle of the output signal being adjustable by the voltage across the variable resistance block, wherein the control signal present on the control signal input lead of the circuit selectively varies the resistance across the variable resistance block.

15. The circuit of claim 1, wherein the circuit comprises:
a first stage that outputs the output signal onto the signal output lead, the first stage comprising at least one set of transistors coupled in parallel, each transistor in said set of transistors having a gate voltage selectable from either an input signal or a turn-off voltage.

16. The circuit of claim 15, the first stage comprising a NAND gate, the NAND gate comprising two sets of transistors coupled in parallel, each transistor in a first set of said two sets of transistors having a gate voltage selectable from either the first input signal or a fixed turn-off voltage, each transistor in a second set of said two sets of transistors having a gate voltage selectable from either the second input signal or the fixed turn-off voltage.

17. The circuit of claim 1, wherein the circuit comprises:
a NAND gate comprising two sets of transistors coupled in parallel, each transistor in a first set of said two sets of transistors having a gate that is couplable to receive a selectable one of the first input signal or a fixed turn-off voltage, and wherein whether the gate of at least one of the transistors the first set is coupled to receive the first input signal or the fixed turn-off voltage is determined by the control signal present on the control signal input lead of the circuit; and
an inverter having an input lead and an output lead, wherein the input lead of the inverter is coupled to an output lead of the NAND gate, and wherein the output lead of the inverter is the signal output lead of the circuit.

18. The circuit of claim 1, wherein the circuit includes a NAND gate and a plurality of configurable transistors, wherein the NAND gate includes two PMOS transistors coupled in parallel to a first supply voltage node of the NAND gate, wherein the transistors of the plurality of configurable transistors are arranged in parallel between the first supply voltage node and a second supply voltage node, and wherein the control signal is supplied onto a gate of at least one of the configurable transistors.

19. The circuit of claim 1, wherein the circuit includes a NAND gate, the NAND gate comprising two sets of PMOS transistors coupled in parallel, each PMOS transistor of the first set of said two sets of PMOS transistors having a gate that is couplable to a selectable one of either the first input signal or a fixed turn-off voltage, wherein which of the first input signal or the fixed turn-off voltage is supplied onto the gate of one of the PMOS transistors of the first set is determined by the control signal received on the control signal input lead.

20. A method for generating a local oscillator signal having an adjustable duty cycle, the method comprising:
generating a first local oscillator signal by determining a first overlap interval between an in-phase signal and a quadrature signal, the first overlap interval defined by a first turn-on level and a first turn-off level; and adjusting the duty cycle of the first local oscillator signal by adjusting the first turn-on level or the first turn-off level, wherein the adjusting the duty cycle of the first local oscillator signal comprises:
selectively adjusting a resistance of a variable resistance block by selectively applying a control signal voltage to at least one of a plurality of control signal input leads corresponding to a plurality of transistors.

21. The method of claim 20, further comprising:
generating a second local oscillator signal by determining a second overlap interval between an inverse in-phase signal and an inverse quadrature signal, the second overlap interval defined by a second turn-on level and a second turn-off level; and adjusting the duty cycle of the second local oscillator signal by adjusting the second turn-on level or the second turn-off level.

22. The method claim 21, further comprising:
mixing a radio-frequency (RF) signal with a differential local oscillator signal comprising the first and second local oscillator signals to produce a first intermediate-frequency (IF) signal;
measuring a characteristic of the first IF signal; and
adjusting the duty cycle of the first or second local oscillator signal in response to the measured characteristic of the first IF signal.

23. The method of claim 22, wherein the characteristic of the first IF signal is a second-order intermodulation product (IM2).

24. The method of claim 23, wherein the adjusting the duty cycle of the first or second local oscillator signal in response to the measured characteristic of the first IF signal involves adjusting the duty cycle of the first or second local oscillator signal to minimize the measured IM2.

25. The method of claim 22, wherein the characteristic of the first IF signal is a residual sideband (RSB).

26. The method of claim 25, wherein the adjusting the duty cycle of the first or second local oscillator signal in response to the measured characteristic of the first IF signal involve adjusting the duty cycle of the first or second local oscillator signal to minimize the measured RSB.

27. The method of claim 20, wherein an NAND gate determines the first overlap interval, wherein the step of adjusting the duty cycle of the first local oscillator signal involves controlling a plurality of configurable transistors, and wherein the plurality of configurable transistors couple a first supply voltage node of the NAND gate to a second supply voltage node.

28. The method of claim 20, wherein an NAND gate determines the first overlap interval, wherein the NAND gate comprises two sets of PMOS transistors coupled in parallel, and wherein the step of adjusting the duty cycle of the first local oscillator signal involves controlling whether a gate of each transistor in a first set of said two sets of PMOS transistors is coupled to receive a selectable one of the in-phase signal or a fixed turn-off voltage.

29. An apparatus for generating a local oscillator signal having an adjustable duty cycle, the apparatus comprising:
means for generating a first local oscillator signal by determining a first overlap interval between an in-phase signal and a quadrature signal, the first overlap interval defined by a first turn-on level and a first turn-off level; and
means for adjusting the duty cycle of the first local oscillator signal by adjusting the first turn-on level or the first turn-off level, wherein the means for adjusting the duty cycle of the first local oscillator signal comprises:

means for selectively adjusting a resistance of a variable resistance block by selectively applying a control signal voltage to at least one of a plurality of control signal input leads corresponding to a plurality of transistors.

30. The apparatus of claim 29, further comprising:
means for determining a second overlap interval between an inverse in-phase signal and an inverse quadrature signal to generate a second local oscillator signal, the second overlap interval defined by a second turn-on level and a second turn-off level; and
means for adjusting the duty cycle of the second local oscillator signal by adjusting the second turn-on level or the second turn-off level.

31. The apparatus of claim 30, further comprising:
a mixer that mixes a radio-frequency (RF) signal with a differential local oscillator signal comprising the first and second local oscillator signals to produce a first intermediate-frequency (IF) signal; and
means for measuring a characteristic of the first IF signal and for controlling at least one of the means for adjusting the duty cycle of the first local oscillator signal and the means for adjusting the duty cycle of the second local oscillator signal in response to the measured characteristic of the first IF signal.

32. The apparatus of claim 31, wherein the characteristic of the first IF signal is a second-order intermodulation product (IM2).

33. A method for generating a local oscillator (LO) signal, the method comprising:
inputting an in-phase (I) local oscillator signal and a quadrature-phase (Q) local oscillator signal to a circuit for determining intervals in which the I signal overlaps the Q signal, wherein the I and Q signals have a first duty cycle, the circuit generating an in-phase LO signal having a second duty cycle less than the first duty cycle; and
supplying a control signal to the circuit and changing the control signal such that the second duty cycle is adjusted, wherein supplying the control signal comprises:
selectively applying a control signal voltage to at least one of a plurality of control signal input leads to variably adjust a resistance of a variable resistance block.

34. The method of claim 33, the circuit comprising an AND circuit for performing an AND operation on the I signal and the Q signal.

35. A computer program product, comprising:
a computer-readable medium, comprising:
at least one instruction for generating a first local oscillator signal by determining a first overlap interval between an in-phase signal and a quadrature signal, the first overlap interval defined by a first turn-on level and a first turn-off level; and
at least one instruction for adjusting the duty cycle of the first local oscillator signal by adjusting the first turn-on level or the first turn-off level, wherein the at least one instruction for adjusting the duty cycle of the first local oscillator signal comprises:
at least one instruction to selectively adjust a resistance of a variable resistance block by selectively applying a control signal voltage to at least one of a plurality of control signal input leads of a corresponding plurality of transistors.

36. The computer program product of claim 35, wherein the computer-readable medium further comprises:
at least one instruction for generating a second local oscillator signal by determining a second overlap interval between an inverse in-phase signal and an inverse quadrature signal, the second overlap interval defined by a second turn-on level and a second turn-off level; and
at least one instruction for adjusting the duty cycle of the second local oscillator signal by adjusting the second turn-on level or the second turn-off level.

37. The computer program product of claim 36, wherein the computer-readable medium further comprises:
at least one instruction for mixing a radio-frequency (RF) signal with a differential local oscillator signal comprising the first and second local oscillator signals to produce a first intermediate-frequency (IF) signal;
at least one instruction for measuring a characteristic of the first IF signal; and
at least one instruction for adjusting the duty cycle of the first or second local oscillator signal in response to the measured characteristic of the first IF signal.

38. The computer program product of claim 37, wherein the characteristic of the first IF signal is a second-order intermodulation product (IM2).

39. The computer program product of claim 38, wherein the at least one instruction for adjusting the duty cycle of the first or second local oscillator signal in response to the measured characteristic of the first IF signal further comprises at least one instruction for adjusting the duty cycle of the first or second local oscillator signal to minimize the measured IM2.

40. The computer program product of claim 37, wherein the characteristic of the first IF signal is a residual sideband (RSB).

41. The computer program product of claim 40, wherein the at least one instruction for adjusting the duty cycle of the first or second local oscillator signal in response to the measured characteristic of the first IF signal further comprises at least one instruction for adjusting the duty cycle of the first or second local oscillator signal to minimize the measured RSB.

* * * * *